(12) United States Patent
Defazio et al.

(10) Patent No.: US 9,255,782 B2
(45) Date of Patent: Feb. 9, 2016

(54) MEMS DEVICE INCLUDING A MOBILE ELEMENT AND A RESISTIVE SENSOR, AND METHOD FOR GENERATING A SIGNAL INDICATING THE POSITION OF THE MOBILE ELEMENT

(71) Applicant: STMicroelectronics S.r.l., Agrate Brianza (IT)

(72) Inventors: Marco Defazio, Merate (IT); Bruno Murari, Monza (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 306 days.

(21) Appl. No.: 13/975,565

(22) Filed: Aug. 26, 2013

(65) Prior Publication Data

US 2014/0062506 A1 Mar. 6, 2014

(30) Foreign Application Priority Data

Aug. 31, 2012 (IT) .............................. TO2012A0758

(51) Int. Cl.
| | |
|---|---|
| *G01R 27/26* | (2006.01) |
| *G01B 7/14* | (2006.01) |
| *G01D 5/24* | (2006.01) |
| *G02B 26/08* | (2006.01) |
| *H04N 9/31* | (2006.01) |

(52) U.S. Cl.
CPC .. *G01B 7/14* (2013.01); *G01D 5/24* (2013.01); *G01R 27/2605* (2013.01); *G02B 26/0841* (2013.01); *H04N 9/3129* (2013.01)

(58) Field of Classification Search
CPC ..... G01R 27/2605; G01D 5/24; G01D 5/241; G01D 5/2412; G01D 5/2417; G06F 3/01; G06F 3/041; G06F 3/044; G06F 3/0488; G06F 3/04883; G01N 27/22; G01N 27/227; G01N 27/228; G01N 27/60; G01N 2015/0853; G01N 2027/22; G06K 9/000006; G06K 9/00013; G06K 9/0002; G01L 1/14; G01L 1/142; G01L 9/0072; G01B 7/14; G01B 7/22; G08B 13/26; G02B 26/0841; H04N 9/3129
USPC ......... 324/516, 519, 600, 649, 658, 661, 686; 345/173, 174; 340/545.4, 562; 73/304 C, 718, 724, 780, 335.04, 73/514.32, 862.337, 862.626; 702/47, 52
See application file for complete search history.

(56) References Cited

U.S. PATENT DOCUMENTS

| | | | |
|---|---|---|---|
| 5,488,862 | A | 2/1996 | Neukermans et al. |
| 5,648,618 | A | 7/1997 | Neukermans et al. |

(Continued)

FOREIGN PATENT DOCUMENTS

| | | |
|---|---|---|
| DE | 19709913 A1 | 10/1998 |
| DE | 102007033000 A1 | 1/2009 |
| EP | 2282404 A1 | 2/2011 |

OTHER PUBLICATIONS

Italian Search Report for TO2012A000758 mailed Apr. 24, 2013 (8 pages).

*Primary Examiner* — Hoai-An D Nguyen
(74) *Attorney, Agent, or Firm* — Gardere Wynne Sewell LLP

(57) ABSTRACT

A MEMS device includes a supporting body, a first deformable element and a second deformable element, and a mobile element set between the first and second deformable elements and rotatable with respect to the fixed supporting body. A generator causes a current to flow through at least one of the first and second deformable elements, which function as resistors, so as to generate an electrical position signal proportional to deformation of the first and second deformable elements and indicative of angular position of the mobile element. The electrical signal is processed to determine mobile element angular position. A drive signal is generated in response to the electrical signal for the purpose of driving oscillation of the mobile element.

26 Claims, 4 Drawing Sheets

(56) References Cited

U.S. PATENT DOCUMENTS

| | | |
|---|---|---|
| 6,744,173 B2 * | 6/2004 | Behin et al. .................. 310/309 |
| 7,049,828 B1 * | 5/2006 | Urquidi ........................ 324/662 |
| 7,088,492 B2 * | 8/2006 | Yanagita et al. ............. 359/290 |
| 8,760,233 B2 * | 6/2014 | Steeneken et al. ............ 331/154 |
| 2004/0061619 A1 | 4/2004 | Kim et al. |
| 2011/0109951 A1 | 5/2011 | Goren et al. |
| 2014/0375340 A1 * | 12/2014 | Mohamed Zuhair et al. 324/684 |

* cited by examiner

MEMS DEVICE INCLUDING A MOBILE ELEMENT AND A RESISTIVE SENSOR, AND METHOD FOR GENERATING A SIGNAL INDICATING THE POSITION OF THE MOBILE ELEMENT

PRIORITY CLAIM

This application claims priority from Italian Application for Patent No. TO2012A000758, filed Aug. 31, 2012, the disclosure of which is incorporated by reference.

TECHNICAL FIELD

The present invention relates to a device of the so-called MEMS (microelectromechanical systems) type, which includes a mobile element and a resistive sensor. Moreover, the present invention relates to a method for generating a signal indicating the position of the mobile element.

BACKGROUND

As is known, numerous MEMS devices are available today. For example, known to the art are the so-called MEMS reflectors, which are designed to receive an optical beam and vary the direction of propagation thereof, in a periodic or quasi-periodic way. For this purpose, MEMS reflectors include mobile elements formed by mirrors, the positions in space of which are controlled electronically.

In greater detail, in a generic MEMS reflector comprising a mirror, the control of position of the mirror is of particular importance for enabling scanning of a portion of space with an optical beam, which is made to impinge upon the mirror. In particular, the control of position of the mirror is a determining factor in the case of resonant MEMS reflectors, in which, in use, the mirror is made to oscillate in a substantially periodic way about a resting position, the period of oscillation being as close as possible to the resonance frequency of the mirror in order to maximize the angular distance covered by the mirror during each oscillation and hence maximize the dimension of the portion of space scanned.

For example, United States Patent Application Publication No. US2011/0109951 (incorporated by reference) describes a circuit for controlling the position of the mirror of a MEMS reflector of a resonant type, this mirror being arranged so as to turn, under the action of a motor of an electrostatic type, about an axis of rotation. In particular, the MEMS reflector comprises a fixed supporting body, made of semiconductor material, and a mirror, which is constrained to the fixed supporting body by means of a first spring and a second spring.

The fixed supporting body comprises a first stator subregion and a second stator subregion, which are connected, respectively, to a first stator electrode and a second stator electrode, and a first rotor subregion and a second rotor subregion, which are connected, respectively, to a first rotor electrode and a second rotor electrode. The first and second stator electrodes enable biasing, respectively, of the first and second stator subregions, whereas the first and second rotor electrodes enable biasing, respectively, of the first and second rotor subregions.

The mirror is mechanically arranged between the first and second springs, each of which has a respective end that is constrained to the fixed supporting body; in particular, the first and second springs are constrained, respectively, to the first and second rotor subregions. The mirror and the first and second springs hence form a resonant system, which has a respective mechanical resonance frequency. In general, the mechanical resonance frequency varies in time, for example, on account of temperature variations.

In greater detail, the voltages of the rotor electrodes and of the stator electrodes, and consequently the voltages of the rotor and stator subregions, are imposed in such a way as to cause oscillation of the mirror about the axis of rotation, with a mechanical oscillation frequency as close as possible to the mechanical resonance frequency. For this purpose, the first and second rotor electrodes are set at a biasing voltage ($V_{bias}$), whereas the first and second stator electrodes receive one and the same electrical command signal, formed by a high-voltage pulse train.

To cause oscillation of the mirror with a mechanical oscillation frequency as close as possible to the mechanical resonance frequency, it is necessary to know the mechanical resonance frequency and it is necessary to generate the pulses of the electrical command signal with appropriate frequency and phase, as a function of the position of the mirror. For these purposes, it is necessary to determine the position of the mirror, and in particular to determine the passages of the mirror through the resting position. Determination of the passages of the mirror through the resting position is made based on a signal proportional to a time derivative of a capacitance associated to the mirror, i.e., by means of a so-called "capacitive sensing".

In detail, detection of the derivative of the capacitance associated to the mirror is performed during monitoring periods, in which the stator electrodes are set at ground, through an electronic circuit. Instead, during the so-called "driving periods", the stator electrodes receive, once again through the electronic circuit, the electrical pulses and are hence set at a positive voltage such as to apply a torque to the mirror so as to keep the latter in oscillation. However, this positive voltage is so high as to cause saturation of an amplifier present inside the electronic circuit, this saturation making it impossible to detect the derivative of the aforementioned capacitance. The fact that the derivative of the aforementioned capacitance cannot be detected during the driving periods imposes a limitation on the duration of the driving periods, and hence of the pulses, which must thus be separated by the monitoring periods to enable updating of the estimate of the mechanical resonance frequency. Consequently, the pulses must be at a particularly high voltage in order to drive the mobile element properly. Moreover, given that the signal is proportional to the time derivative of the aforementioned capacitance, the determination of the corresponding position of the mirror requires to have available a processing unit, which must implement rather complex correlation algorithms.

U.S. Pat. No. 5,648,618 (incorporated by reference) describes, instead, a MEMS device in which, set above each spring, is a corresponding piezoresistor, the resistance of which varies as a function of the torsion that the respective spring undergoes. The MEMS reflector hence forms a piezoresistive sensor designed to generate an electrical signal indicating the angular position of the mirror, on the basis of which the position of the mirror is controlled. However, on account of the use of this piezoresistive sensor, the MEMS reflector is characterized by a certain circuit complexity; moreover, manufacture of the MEMS reflector must be made in such a way that, at the end thereof, the piezoresistors do not present residual stresses.

There is a need in the art to provide a MEMS device that will overcome at least in part the drawbacks of the known art.

SUMMARY

In an embodiment, a MEMS device comprises: a fixed supporting body; a first deformable element and a second deformable element constrained to the fixed supporting body; a mobile element interposed between, and connected to, said first and second deformable elements, the mobile element being rotatable with respect to the fixed supporting body, with consequent deformation of the first and second deformable elements; and a generator configured to cause a current to flow through at least one of the first and second deformable elements, so as to generate an electrical position signal proportional to at least one of a first resistance, of the first deformable element, and a second resistance, of the second deformable element, said first and second resistances being, respectively, proportional to deformations of the first and second deformable elements and indicative of an angular position of the mobile element.

In an embodiment, A method is presented for generating an electrical signal indicating the angular position of a mobile element of a MEMS device. The MEMS device includes a fixed supporting body, a first deformable element and a second deformable element constrained to the fixed supporting body, the mobile element being interposed between, and connected to, said first and second deformable elements, and being rotatable with respect to the fixed supporting body, with consequent deformation of the first and second deformable elements. The method comprises: causing a current to flow through at least one of the first and second deformable elements in such a way as to generate said electrical signal having a value proportional to at least one of a first resistance, of the first deformable element, and a second resistance, of the second deformable element, said first and second resistances being, respectively, proportional to the deformations of the first and second deformable elements.

In an embodiment, an apparatus comprises: a rotatable MEMS structure supported for oscillation by a first tortional member formed of a semiconductor material that defines a first resistor having a first resistance that varies as a function of deformation of the first tortional member; and a generator configured to cause a current to flow through the first resistor so as to generate an electrical position signal having a value proportional to said first resistance and indicative of an angular position of the rotatable MEMS structure.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF THE DRAWINGS

In what follows, embodiments are described, purely by way of example, with reference to the case of a MEMS device designed to reflect an optical beam in an electronically controllable way, and hence including at least one mirror. The presence of this mirror, however, is in no way necessary for the purposes of the present invention, which may hence find application in fields different from the field of MEMS reflectors.

Figure 1:
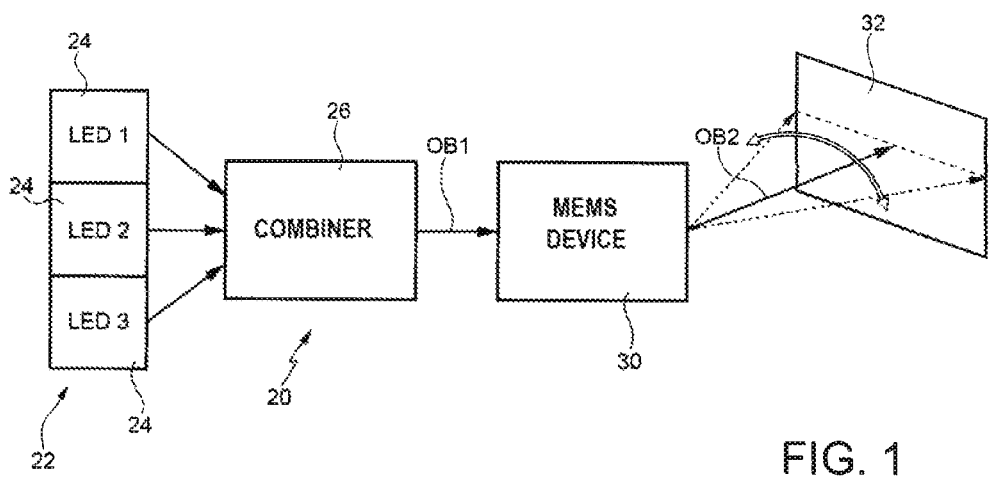
FIG. 1 shows a block diagram of a projective MEMS system.

This being said, FIG. 1 shows a projective MEMS system 20, which includes a light source 22 formed by a plurality of LEDs 24, each of which emits electromagnetic radiation at a corresponding wavelength. For example, FIG. 1 shows three LEDs 24, each of which emits radiation, respectively, in the region of the red (620-750 nm), of the green (495-570 nm), and of the blue (450-475 nm).

The projective MEMS system 20 further comprises a combiner 26, a MEMS device 30, and a display 32. The combiner 26 is set downstream of the light source 22 so as to receive the electromagnetic radiation emitted by the LEDs 24 and form a single optical beam OB1, obtained by combination of this electromagnetic radiation. The combiner 26 is moreover designed to direct the optical beam OB1 onto the MEMS device 30; in turn, the MEMS device 30, described in greater detail hereinafter, is designed to generate a reflected optical beam OB2 and to send the reflected optical beam OB2 onto the display 32 so as to enable formation of images on the display 32.

In detail, the MEMS device 30 is designed to vary in time the orientation in space of the axis of the reflected optical beam OB2 so as to scan periodically portions of the display 32; in particular, the reflected optical beam OB2 linearly scans a portion of the display 32, possibly all of it.

Figure 2:
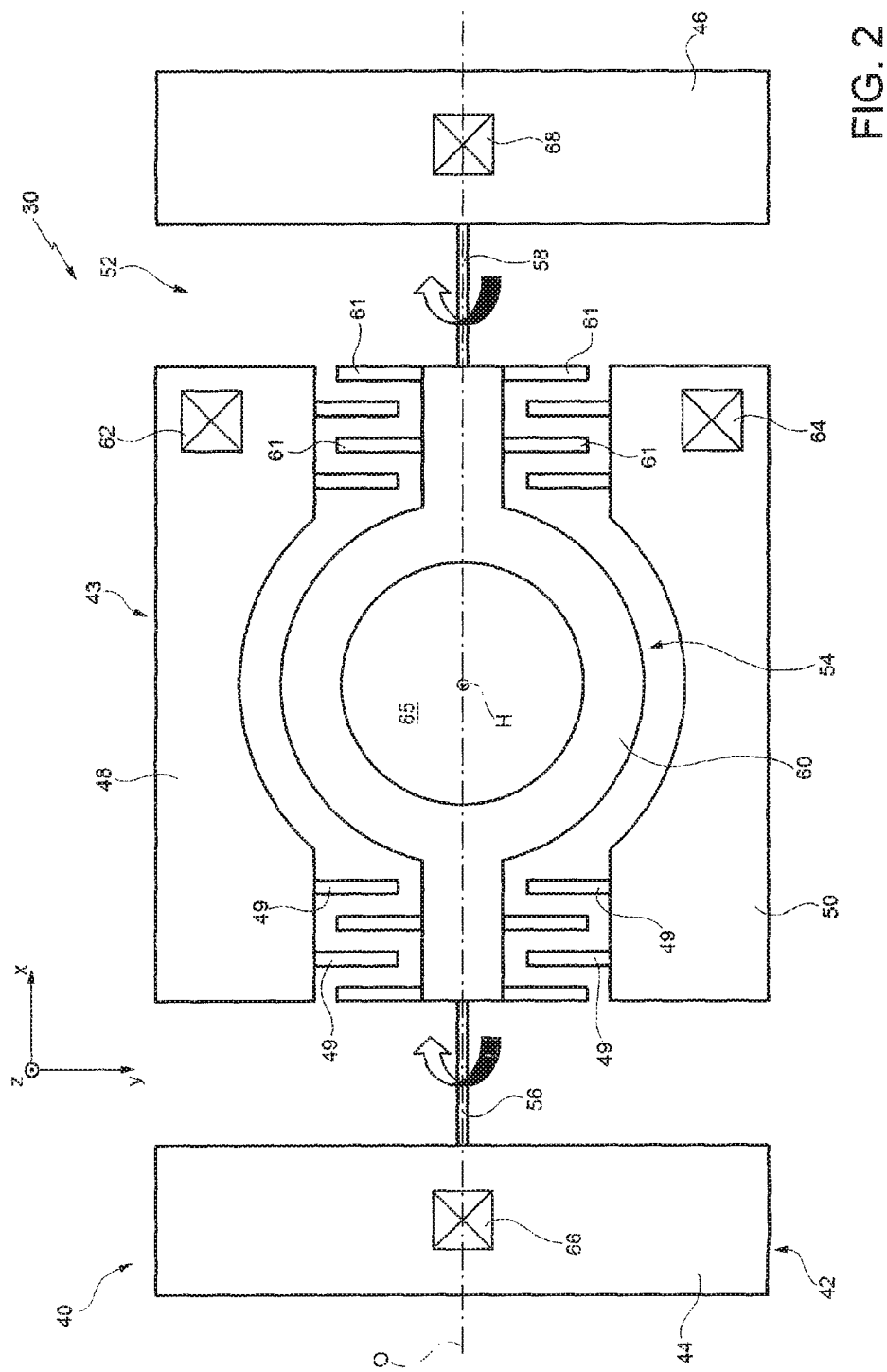
FIG. 2 is a schematic top plan view of a MEMS device.
Figure 3:
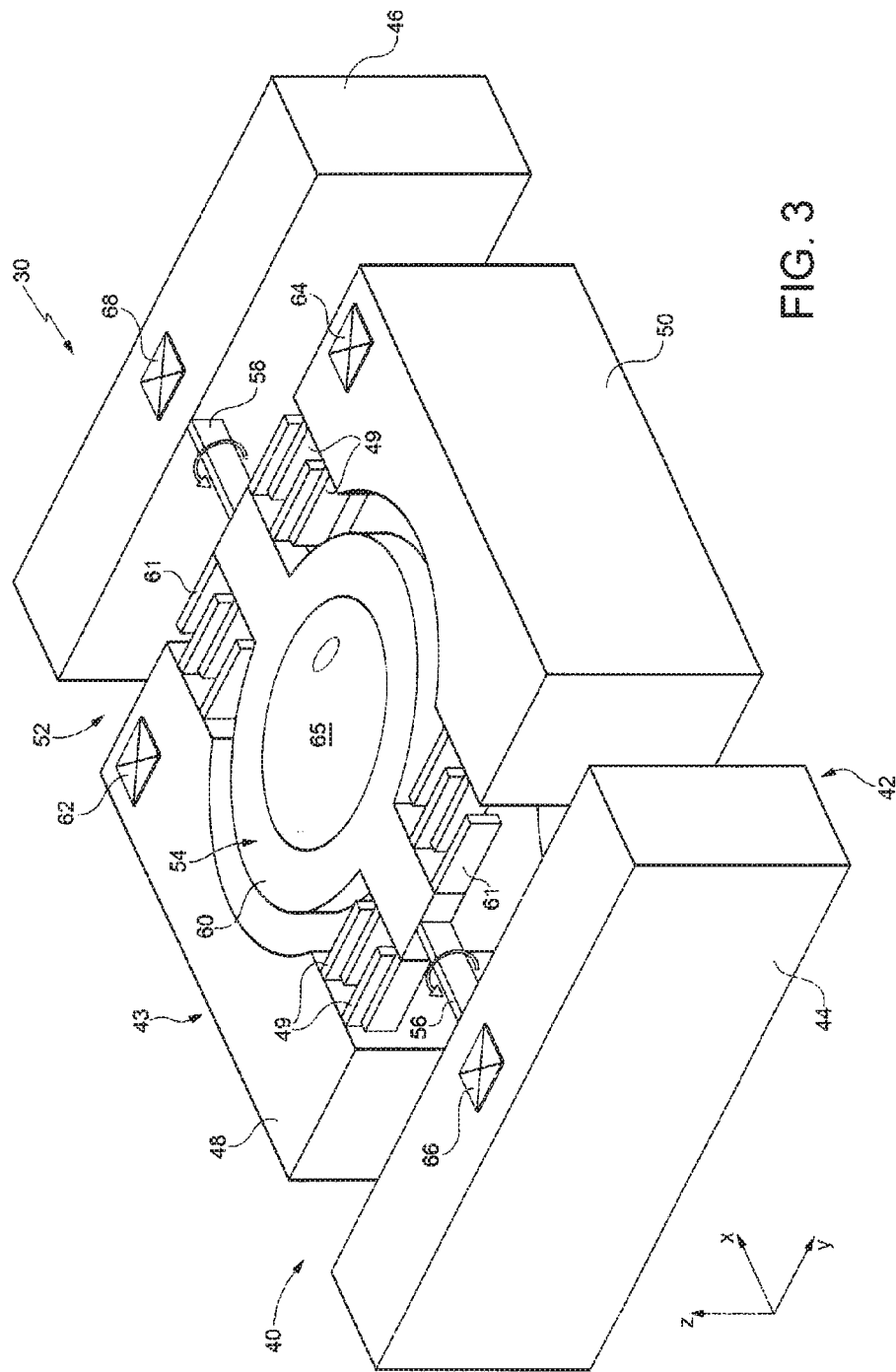
FIG. 3 is a schematic perspective view of the MEMS device shown in FIG. 2.

As shown in FIGS. 2 and 3, the MEMS device 30 comprises a fixed supporting body 40, made of semiconductor material, which includes a first semiconductor region 42 and a second semiconductor region 43, electrically insulated from one another. In particular, the MEMS device 30 has an axis H; moreover, assuming an orthogonal reference system formed by three axes x, y, z and such that the axis z is parallel to the axis H, the first semiconductor region 42 comprises a first rotor subregion 44 and a second rotor subregion 46, arranged diametrically opposite with respect to the axis H, along an axis O parallel to the axis x. Moreover, the second semiconductor region 43 comprises a first stator subregion 48 and a second stator subregion 50, arranged diametrically opposite with respect to the axis H, in a direction parallel to the axis y. In the embodiment shown in FIG. 2, each one of the first and second stator subregions 48, 50 forms a plurality of elongated elements 49, which will be referred to hereinafter as fingers 49. The fingers 49 extend parallel to the axis y and are organized in a first plurality and a second plurality. In particular, the fingers of the first plurality extend starting from the first stator subregion 48, in the direction of the second stator subregion 50, and are aligned to one another in a direction parallel to the axis x, whereas the fingers of the second plurality extend starting from the second stator subregion 50, in the direction of the first stator subregion 48, and are also aligned parallel to the axis x.

The fixed supporting body 40 defines a cavity 52. In addition, the MEMS device 30 comprises a mobile body 54, which is constrained to the first and second rotor subregions 44, 46 and is suspended above the cavity 52.

The mobile body 54 is formed by a first deformable element 56 and a second deformable element 58, as well as by a mobile element 60, which is connected between the first and second deformable elements 56, 58; more in particular, the mobile element 60, the first and second deformable elements 56, 58, and the first and second rotor subregions 44, 46 form a single piece, i.e., belong to a monolithic structure of semiconductor material.

In detail, a first end of the first deformable element 56 is constrained to the first rotor subregion 44, whereas a first end of the second deformable element 58 is constrained to the second rotor subregion 46. Moreover, a first end and a second end of the mobile element 60 are fixed, respectively, with respect to a second end of the first deformable element 56 and with respect to a second end of the second deformable element 58.

In greater detail, the first and second deformable elements 56, 58 and the mobile element 60 are made of semiconductor material. In addition, in resting conditions, each one of the first and second deformable elements 56, 58 has, for example, the shape of a parallelepiped, the dimension of which parallel to the axis x is greater than the corresponding dimensions along the axes y and z; for example, the dimension parallel to the axis x is at least five times greater than the dimensions along the axes y and z. In resting conditions, each one of the first and second deformable elements 56, 58 has two faces arranged in planes parallel to the plane xy.

The mobile element 60 carries a mirror 65, formed, for example, by a film of metal material, such as, for example, copper. Moreover, in the embodiment shown in FIG. 2, the mobile element 60 defines a respective plurality of fingers 61, which extend parallel to the axis y and are arranged in such a way that, in resting conditions, they are comb-fingered with the fingers 49 formed by the first and second stator subregions 48, 50.

For practical purposes, the first and second deformable elements 56, 58 function, respectively, as first and second springs, since each of them can undergo a torsion about the axis O, for the reasons described hereinafter, and then return into the position assumed in resting conditions. In fact, the shape of the first and second deformable elements 56, 58 bestows thereon a low torsional stiffness, for example, comprised between $10^{-4}$ and $10^{-3}$ N/rad. The mobile element 60 and the mirror 65 can hence rotate about the axis O.

The MEMS device 30 further comprises a first stator electrode 62 and a second stator electrode 64, which are arranged in contact with the first and second stator subregions 48, 50 and enable biasing of the latter. In addition, the MEMS device 30 comprises a first rotor electrode 66 and a second rotor electrode 68, which are arranged in contact with the first and second stator subregions 44, 46 and enable biasing of the latter.

Figure 4:
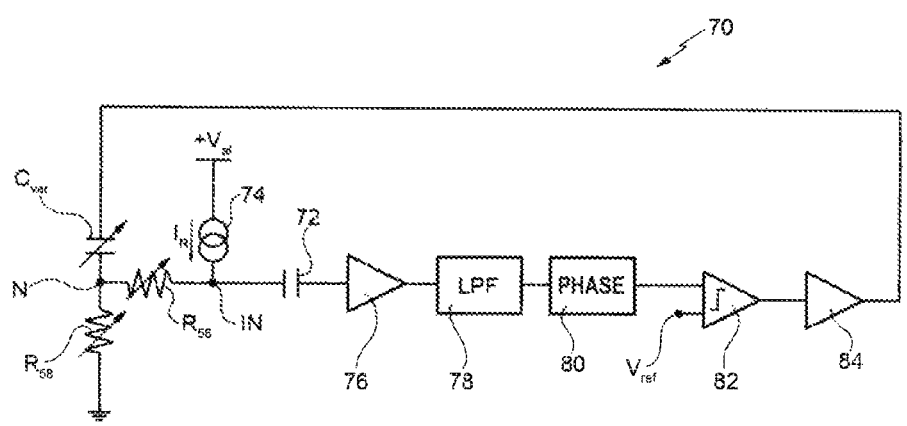
FIG. 4 shows a circuit diagram of an electronic control circuit.

The MEMS device 30 further comprises an electronic control circuit 70, shown in FIG. 4.

The electronic control circuit 70 comprises an input capacitor 72 having a first terminal and a second terminal, and a current generator 74, which is connected between a power-supply node and the first terminal of the input capacitor 72 and generates, in use, a reference current $I_R$ of a continuous type. The power-supply node is set at a supply voltage $+V_{al}$, for example, equal to 3 V. Moreover, the reference current $I_R$ is, for example, equal to 1 mA.

The electronic control circuit 70 further comprises a first amplifier 76, the input of which is connected to the second terminal of the input capacitor 72, and a low-pass filter 78, the input of which is connected to the output of the first amplifier 76.

The electronic control circuit 70 further comprises a phase-shifter 80, the input of which is connected to the output of the low-pass filter 78, and a comparator 82, which has two inputs and one output; a first input of the comparator 82 is connected to the output of the phase-shifter 80, whereas a second input of the comparator 82 is set at a reference voltage $V_{ref}$. The electronic control circuit 70 further comprises a second amplifier 84, the input of which is connected to the output of the comparator 82. The output of the second amplifier is connected to the first and second stator electrodes 62, 64.

The first rotor electrode 66 is connected to the first terminal of the input capacitor 72, and hence to the current generator 74, in such a way that, in use, the reference current $I_R$ is injected into the first rotor electrode 66. The reference current $I_R$ hence flows through the first deformable element 56, the mobile element 60, and the second deformable element 58 until it reaches the second rotor electrode 68, which is set at ground. Without any loss of generality, it is hence assumed that the second rotor electrode 68 is connected to ground without interposition of any resistor. It is moreover assumed, once again without any loss of generality, that each one between the first and second rotor electrodes 66, 68 is ideal, and will hence have zero resistance.

The first and second deformable elements 56, 58 are electrically equivalent to a first variable resistor $R_{56}$ and a second variable resistor $R_{58}$, the resistance values of which depend upon the corresponding torsions to which the first and second deformable elements 56, 58 are subjected; in particular, this is due to the fact that the resistance of each deformable element is proportional to the mechanical stress to which the deformable element is subjected. The resistances of the first and second variable resistors $R_{56}$, $R_{58}$ are hence proportional to the modulus of the angular distance θ of the mobile element 60 with respect to the position assumed in resting conditions, also referred to as "resting position". It follows that the first variable resistor $R_{56}$ is connected between the first terminal of the input capacitor 72 and a node N, whereas the second variable resistor $R_{58}$ is connected between the node N and ground. The node N corresponds electrically to the mobile element 60, on which there is substantially no voltage drop, or in any case there is a voltage drop that does not depend upon the angular position of the mobile element 60. In what follows, for reasons of simplicity and without any loss of generality, it is assumed that on the mobile element 60 there is no voltage drop.

In practice, the mobile element 60 and the first and second deformable elements 56, 58 form a series circuit connected between the first and second rotor electrodes 66, 68, the resistance of which $R_{tot}$ is equal to the sum of the resistances of the first and second variable resistors $R_{56}$, $R_{58}$. Consequently, the resistance $R_{tot}$ has a variable part, which is proportional to the angular distance of the mobile element 60 from the resting position, and a continuous part, possibly zero.

Moreover, the reference current $I_R$ and the first and second deformable elements 56, 58 are such that, also in conditions of high torsion, i.e., close to failure of the deformable elements, the voltage on the first terminal of the input capacitor 72, and hence, all the more, the voltage on the mobile element 60, does not exceed 2 V.

The fingers 49 of the first and second stator subregions 48, 50 form, together with the fingers 61 of the mobile element 60, a variable capacitor $C_{var}$, the capacitance of which is inversely proportional to the angular distance θ of the mobile element 60 with respect to the position assumed in resting conditions. The variable capacitor $C_{var}$ is hence connected between the output of the second amplifier 84 and the node N.

Figure 5:
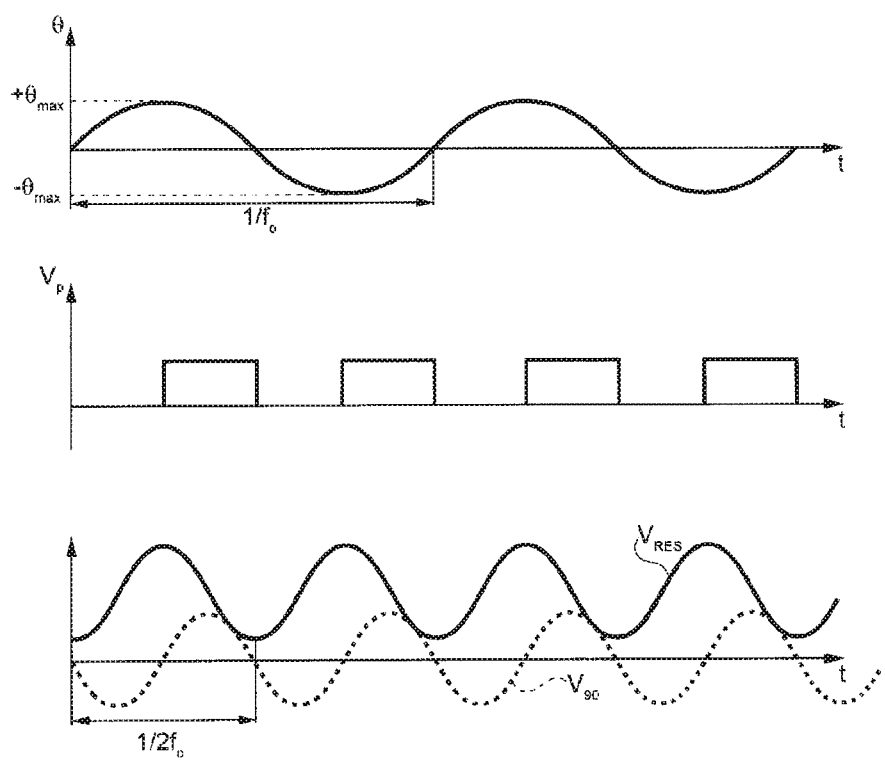
FIG. 5 shows: a time plot of the angular position of a mobile element of a MEMS device; a time plot of an electrical driving signal; and the time plots of a pair of electrical signals indicating values of resistance of deformable elements present in the MEMS device shown in FIGS. 1 and 2.

Designating as input node IN the first terminal of the input capacitor 72, generated, in use, on this input node IN is an input signal that is proportional to the resistance $R_{tot}$, i.e., to the voltage drop on the first and second deformable elements 56, 58, and hence depends upon the angular distance θ of the mobile element 60. Consequently, the input signal indicates the position of the mobile element 60, and hence of the mirror 65. An example of the correlation existing between the angular distance θ of the mobile element 60 and the input signal is shown in FIG. 5, where the input signal is designated by $V_{RES}$.

In other words, the input signal $V_{RES}$ is proportional to the voltage present between the first and second rotor electrodes 66, 68, and hence to the voltage present between the first and second rotor subregions 44, 46.

Present on the second terminal of the input capacitor 72 is a first intermediate signal, which is amplified by the first amplifier 76, which generates a second intermediate signal. The second intermediate signal is filtered by the low-pass filter 78, which generates a third intermediate signal, filtering possible peaks of the second intermediate signal, these peaks being caused, for example, by application of the driving signal $V_p$ to the stator electrodes. The phase-shifter 80 generates a fourth intermediate signal, which has a phase delayed by 90° with respect to the phase of the third intermediate signal; for this purpose, and in a way in itself known, the phase-shifter 80 may be formed, for example, by a phase-locked loop of an analog type. An example of fourth intermediate signal is shown once again in FIG. 5, where it is designated by $V_{90}$.

The comparator 82 compares the fourth intermediate signal with the reference voltage $V_{ref}$, which is set equal, for example, to the mean value of the fourth intermediate signal.

In particular, whenever the voltage of the fourth intermediate signal exceeds the reference voltage $V_{ref}$, the comparator 82 generates a rising edge of a preliminary signal $V_{pre}$ at output from the comparator 82 itself. In addition, whenever the voltage of the fourth intermediate signal drops below the reference voltage $V_{ref}$, the comparator 82 generates a falling edge of the preliminary signal $V_{pre}$.

The preliminary signal $V_{pre}$ is amplified by the second amplifier 84, which generates a driving signal $V_p$, which is formed by a train of pulses. Each pulse has a positive voltage in the region of, for example, 150-200 V, in such a way that, when a pulse is applied to the first and second stator electrodes 62, 64, the mobile element 60 is at a voltage markedly lower than the voltage of the first and second stator subregions 48, 50, and in particular lower by at least 20 V, preferably 50 V, for any value of the angular distance θ of the mobile element 60. An electrostatic force is thus generated that tends to attract the plates of the variable capacitor $C_{var}$ between them, namely, the mobile element and the stator subregions. Moreover, designating by $f_o$ the mechanical oscillation frequency of the mobile element 60, it is found that each one from among the fourth intermediate signal, the preliminary signal $V_{pre}$, and the driving signal $V_p$ has an electrical frequency equal to $2 \cdot f_o$.

In detail, the driving signal $V_p$ (shown in FIG. 5) has a duty cycle equal to 50% and is supplied by the second amplifier 84 on the first and second stator electrodes 62, 64. The first and second stator electrodes 62, 64 hence receive the electrical pulses generated by the second amplifier 84. Moreover, the driving signal $V_p$ is synchronous with the fourth intermediate signal $V_{90}$ and with the input signal $V_{RES}$.

In greater detail, if we designate by $\theta_{max}$ the modulus of the maximum angular distance from the resting position assumed by the mobile element 60 during a single oscillation, each electrical pulse extends in time during a time interval in which the angular distance of the mobile element 60 is comprised in the interval $[\theta_{max}, 0°]$ or $[-\theta_{max}, 0°]$; consequently, during each electrical pulse, there does not occur any passage through the resting position by the mobile element 60. There hence exists a phase relation between the driving signal $V_p$ and the curve defined by the evolution in time of the angular distance θ, which will be referred to hereinafter as "distance signal". More in particular, the phase relation envisages that each electrical pulse extends in time in a corresponding time interval, during which the derivative of the modulus of the distance signal is negative. In what follows this phase relation will be referred to as "relation of synchronism".

Application of each electrical pulse to the first and second stator electrodes 62, 64 hence entails application of a corresponding torque of an electrostatic nature, which keeps the mobile element 60 in oscillation. In fact, assuming that the mobile element 60 is oscillating and is at an angular distance $+\theta_{max}$, application to the first and second stator electrodes 62, 64 of a first electrical pulse causes generation of a torque that tends to bring the mobile element 60 back into the resting position, with consequent reduction of the torsion to which the first and second deformable elements 56, 58 are subjected. Once the resting position has been reached, application of the torque ceases, but the mobile element 60, on account of its own inertia, passes beyond the resting position, until it reaches an angular distance $-\theta_{max}$, at which a second electrical pulse is applied to the first and second stator electrodes 62, 64. A further torque is thus generated, which tends to bring the mobile element 60 back into the resting position, and so forth. The electrical pulses are hence distributed in time in such a way as to keep the mobile element 60 in oscillation about the axis O.

In greater detail, it is possible to verify that, assuming that the mobile element 60 is in resonance, namely, that the mechanical oscillation frequency $f_o$ is equal to the mechanical resonance frequency $f_r$ of the mobile element 60, the electronic control circuit 70 is able to track possible variations of the mechanical resonance frequency $f_r$, i.e., is able to drive the mobile element 60 in such a way that it oscillates with a mechanical oscillation frequency substantially equal to the mechanical resonance frequency. In other words, the electronic control circuit 70 operates in such a way that the electrical frequency of the driving signal $V_p$ is substantially equal $2 \cdot f_r$.

In practice, the electronic control circuit 70 forms a closed control loop. Moreover, except for the variable capacitor $C_{var}$ and for the first and second variable resistors 56, 58, the remaining elements of the electronic control circuit may be formed, for example, in a further fixed supporting body (not shown) made of semiconductor material. In any case possible are, for example, embodiments in which the second amplifier 84 is formed in the fixed supporting body 40, or else in which, once again by way of example, the electronic control circuit 70 is formed entirely inside the fixed supporting body 40. Irrespective of the details of implementation, the operation of the electronic control circuit 70 can be described, in a simplified way, adopting a discrete-time evolution, as is common practice in the analysis of feedback systems, and on the hypothesis of "breaking" the closed control loop at the output of the comparator 82.

In detail, in the case where there is a small variation of the mechanical resonance frequency $f_r$, for example, on account of a variation in temperature, the mobile element 60 tends to continue its oscillation with a mechanical oscillation frequency equal to half the electrical frequency of the driving signal $V_p$. However, since the motion of the mobile element 60 is similar to the motion of a mass-spring system, which in turn can be described by means of a second-order differential equation, this variation causes a phase shift between the distance signal and the driving signal $V_p$. Consequently, there occurs a modification of the aforementioned relation of synchronism; the rising edges of the electrical pulses of the driving signal $V_p$ tend to be in advance, or else delayed, with respect to the aforementioned distance signal.

In the absence of the closed control loop, the comparator 82 would tend to switch the voltage on its own output at instants different from the instants in which there occur the rising/ falling edges of the driving signal $V_p$. Instead, in the case of the electronic control circuit 70, the closed control loop intervenes, albeit with a delay that depends upon its own band. Consequently, once a transient has died out, the driving signal $V_p$ again synchronizes with the output of the comparator 82, in such a way that the driving signal $V_p$ and the distance signal respect once again the aforementioned relation of synchronism. In practice, it happens that, in order to guarantee that the driving signal $V_p$ and the distance signal respect the relation of synchronism, the electrical frequency of the driving signal $V_p$ varies so as to enable tracking of the mechanical resonance frequency $f_r$. In this way, thanks to the electronic control circuit 70, the mobile element 60 continues to oscillate with a frequency substantially equal to the mechanical resonance frequency.

Different embodiments are in any case possible, in which the driving signal $V_p$ is generated once again as a function of the input signal $V_{RES}$, but in a way different from what has been described. For example, the driving signal $V_p$ can be generated by using a digital processing unit, after prior generation of a digital signal proportional to the input signal $V_{RES}$, and subsequent processing of said digital signal by the digital processing unit.

Moreover, the driving signal $V_p$ may be such as to drive the oscillation of the mobile element 60 at a mechanical frequency different from the mechanical resonance frequency $f_r$, or else may be such as to enable acceleration or braking of the rotary motion of the mobile element 60 about the axis O.

The advantages that the present MEMS device affords emerge clearly from the foregoing description. In particular, the present MEMS device enables detection of the position of the mobile element on the basis of an electrical signal that is a function of the deformation of the first and second deformable elements and is obtained by causing a current to flow through these first and second deformable elements, without the need to provide further electronic elements on the mobile body 54. Moreover, this electrical signal can be usefully employed, for example, to implement a closed loop for the control of the position of the mobile element 60, as described previously; in this way, it is not necessary to uncouple the step of detecting the position of the mobile element 60 from the step of driving the mobile element 60, i.e., from the step of actuating the electrostatic motor.

The present MEMS device moreover enables driving of the mobile element 60 without the need to resort to a complex processing unit or to ADC/DAC converters. In fact, the present MEMS device employs a resistive sensor, formed by the current generator, which enables generation of the aforementioned input signal $V_{RES}$. The input capacitor 72, the first amplifier 76, the low-pass filter 78, the phase-shifter 80, the comparator 82, and the second amplifier 84 form an electrical actuation circuit, which generates the driving signal $V_p$, based on the input signal $V_{RES}$.

Finally, it is clear that modifications and variations may be made to what has been described and illustrated herein, without thereby departing from the scope of protection of the present invention, as defined in the annexed claims.

Purely by way of example, the fingers may be absent; in other words, it is possible for one or more from among the mobile element 60 and the first and second stator subregions 48, 50 not to form any elongated element.

Moreover, embodiments are possible in which the input signal $V_{RES}$, present on the input node IN, is proportional just to one between the resistances of the first and second variable resistors $R_{56}$, $R_{58}$.

Moreover possible are embodiments in which the first and second stator subregions 48, 50 form a single monolithic stator region, and hence are not physically separated from one another. In this case, one between the first and second stator electrodes may be absent. It is moreover possible for one between the first and second stator subregions to be absent.

Finally, it is possible for at least one between the first and second deformable elements to be made of a material different from a semiconductor, such as, for example, a metal.

What is claimed is:

1. A MEMS device, comprising:
    a fixed supporting body;
    a first deformable element and a second deformable element constrained to the fixed supporting body;
    a mobile element interposed between, and connected to, said first and second deformable elements, the mobile element being rotatable with respect to the fixed supporting body, with consequent deformation of the first and second deformable elements; and
    a generator configured to cause a current to flow through the first deformable element, the mobile element and the second deformable element, so as to generate an electrical position signal proportional to a sum of a first resistance of the first deformable element and a second resistance of the second deformable element, said first and second resistances being, respectively, proportional to deformations of the first and second deformable elements and indicative of an angular position of the mobile element.

2. The MEMS device according to claim 1, further comprising a processing circuit configured to process said electrical position signal to determine the angular position of the mobile element.

3. The MEMS device according to claim 1, wherein the fixed supporting body forms a first rotor subregion and a second rotor subregion, to which the first and second deformable elements are constrained, respectively, in such a way that the mobile element and the first and second deformable elements are electrically interposed between the first and second rotor subregions.

4. The MEMS device according to claim 1, wherein the first and second rotor subregions, the mobile element and the first and second deformable elements are made of semiconductor material and form a single piece.

5. The MEMS device according claim 1, further comprising an electrical actuation circuit configured to exert a torque on the mobile element as a function of the electrical position signal.

6. The MEMS device according to claim 5, wherein the fixed supporting body moreover forms a first stator subregion, and wherein the electrical actuation circuit is configured to generate an electrical driving signal based on the electrical position signal and to apply to the first stator subregion said electrical driving signal.

7. The MEMS device according to claim 6, wherein the fixed supporting body moreover forms a second stator subregion, and wherein the electrical actuation circuit is moreover configured to apply the electrical driving signal also to the second stator subregion.

8. The MEMS device according to claim 7, wherein each of the first and second deformable elements has a first dimension, a second dimension and a third dimension, measured, respectively, in a first direction, a second direction and a third direction that are mutually orthogonal, said first dimension being greater than said second and third dimensions, said first and second stator subregions being arranged in such a way that, when they receive the electrical driving signal, the mobile element rotates about an axis of rotation parallel to the first direction.

9. The MEMS device according to claim 1, wherein the electrical actuation circuit comprises:
a phase-shifter circuit configured to generate a shifted electrical signal, which is shifted by 90° with respect to the electrical position signal; and
a comparator circuit configured to compare the shifted electrical signal with an electrical threshold and to generate, at each crossing of the electrical threshold by the shifted electrical signal, a corresponding edge of the electrical driving signal.

10. The MEMS device according to claim 1, further including a reflecting element, which is designed to reflect electromagnetic radiation and is constrained to the mobile element.

11. The MEMS device according to claim 7, wherein the first and the second stators further comprise fingers forming a variable capacitor with fingers of the mobile element.

12. The MEMS device according to claim 11, wherein the fingers of the first and the second stators are attracted to the fingers of the mobile element with an electrostatic force in response to a control voltage applied to the variable capacitor, the electrostatic force actuating the mobile element.

13. The MEMS device according to claim 12, wherein the electrostatic force actuates the mobile element to oscillate about the first and the second deformable element at about a resonant frequency.

14. The MEMS device according to claim 12, wherein the control voltage is generated in a closed loop control circuit in response to a first variable resistance of the first deformable element and a second variable resistance of the second deformable element, wherein the first variable resistance is proportional to a mechanical stress in the first deformable element and the second variable resistance is proportional to a mechanical stress in the second deformable element.

15. A method for generating an electrical signal indicating the angular position of a mobile element of a MEMS device including a fixed supporting body, a first deformable element and a second deformable element constrained to the fixed supporting body, the mobile element being interposed between, and connected to, said first and second deformable elements, and being rotatable with respect to the fixed supporting body, with consequent deformation of the first and second deformable elements, said method comprising:
causing a current to flow through the first deformable element, the mobile element, and the second deformable element to generate said electrical signal having a value proportional to a sum of a first resistance of the first deformable element and a second resistance of the second deformable element, said first and second resistances being, respectively, proportional to the deformations of the first and second deformable elements.

16. The method according to claim 15, wherein the fixed supporting body forms a first rotor subregion and a second rotor subregion, to which the first and second deformable elements are, respectively, constrained in such a way that the mobile element and the first and second deformable elements are electrically interposed between the first and second rotor subregions.

17. An apparatus, comprising:
a rotatable MEMS structure supported for oscillation by a first torsional member formed of a semiconductor material that defines a first resistor having a first resistance that varies as a function of deformation of the first torsional member; and
a generator configured to cause a current to flow through the first torsional member and the rotatable MEMS structure so as to generate an electrical position signal having a value proportional to said first resistance and indicative of an angular position of the rotatable MEMS structure.

18. The apparatus of claim 17, wherein the rotatable MEMS structure is further supported by a second torsional member formed of a semiconductor material that defines a second resistor have a second resistance that varies as a function of deformation of the second torsional member.

19. The apparatus of claim 18, wherein said current flows through the first torsional member, the rotatable MEMS structure and the second torsional member and the value of the electrical position signal is proportional to a sum of said first and second resistances and indicative of the angular position of the rotatable MEMS structure.

20. The apparatus of claim 19, wherein said first and second torsional members are positioned on opposite sides of the rotatable MEMS structure.

21. The MEMS device according to claim 17, further comprising a processing circuit configured to process said electrical position signal to determine the angular position of the rotatable MEMS structure.

22. The MEMS device according to claim 21, wherein the processing circuit is further operable to generate a drive signal, in response to said electrical position signal, for the purpose of driving oscillation of the rotatable MEMS structure.

23. The MEMS device according to claim 17, further comprising a stator structure positioned adjacent to the rotatable MEMS structure, the stator structure and rotatable MEMS structure defining a capacitor having a capacitance that varies as a function of the rotatable MEMS structure.

24. The MEMS device according to claim 23, wherein a first plate of the capacitor is coupled to a terminal of said first resistor.

25. A MEMS device, comprising:
a fixed supporting body;
a first deformable element and a second deformable element constrained to the fixed supporting body;
a mobile element interposed between, and connected to, said first and second deformable elements, the mobile element being rotatable with respect to the fixed supporting body, with consequent deformation of the first and second deformable elements;
a generator configured to cause a current to flow through at least one of the first and second deformable elements, so as to generate an electrical position signal proportional to at least one of a first resistance, of the first deformable element, and a second resistance, of the second deformable element, said first and second resistances being, respectively, proportional to deformations of the first and second deformable elements and indicative of an angular position of the mobile element;
an electrical actuation circuit configured to exert a torque on the mobile element as a function of the electrical position signal;
wherein the fixed supporting body moreover forms a second stator subregion, and wherein the electrical actuation circuit is moreover configured to apply the electrical driving signal also to the second stator subregion; and
wherein each of the first and second deformable elements has a first dimension, a second dimension and a third dimension, measured, respectively, in a first direction, a second direction and a third direction that are mutually orthogonal, said first dimension being greater than said second and third dimensions, said first and second stator subregions being arranged in such a way that, when they receive the electrical driving signal, the mobile element rotates about an axis of rotation parallel to the first direction.

26. A MEMS device, comprising:
a fixed supporting body;
a first deformable element and a second deformable element constrained to the fixed supporting body;
a mobile element interposed between, and connected to, said first and second deformable elements, the mobile element being rotatable with respect to the fixed supporting body, with consequent deformation of the first and second deformable elements;
a generator configured to cause a current to flow through at least one of the first and second deformable elements, so as to generate an electrical position signal proportional to at least one of a first resistance, of the first deformable element, and a second resistance, of the second deformable element, said first and second resistances being, respectively, proportional to deformations of the first and second deformable elements and indicative of an angular position of the mobile element;
an electrical actuation circuit configured to exert a torque on the mobile element as a function of the electrical position signal; and
wherein the electrical actuation circuit comprises:
a phase-shifter circuit configured to generate a shifted electrical signal, which is shifted by 90° with respect to the electrical position signal; and
a comparator circuit configured to compare the shifted electrical signal with an electrical threshold and to generate, at each crossing of the electrical threshold by the shifted electrical signal, a corresponding edge of the electrical driving signal.

* * * * *